(12) United States Patent
Jian

(10) Patent No.: US 8,786,384 B2
(45) Date of Patent: Jul. 22, 2014

(54) SELF-MATCHED BAND REJECT FILTER

(75) Inventor: Chun-Yun Jian, Ottawa (CA)

(73) Assignee: Apple Inc., Cupertino, CA (US)

( * ) Notice: Subject to any disclaimer, the term of this patent is extended or adjusted under 35 U.S.C. 154(b) by 602 days.

(21) Appl. No.: 13/125,362

(22) PCT Filed: Nov. 2, 2009

(86) PCT No.: PCT/CA2009/001564
§ 371 (c)(1),
(2), (4) Date: Jun. 8, 2011

(87) PCT Pub. No.: WO2010/048725
PCT Pub. Date: May 6, 2010

(65) Prior Publication Data
US 2011/0235557 A1    Sep. 29, 2011

Related U.S. Application Data

(60) Provisional application No. 61/110,147, filed on Oct. 31, 2008.

(51) Int. Cl.
| | | |
|---|---|---|
| *H03H 9/70* | (2006.01) | |
| *H03H 9/72* | (2006.01) | |
| *H03H 9/54* | (2006.01) | |
| *H03H 9/64* | (2006.01) | |
| *H04B 1/38* | (2006.01) | |
| *H04B 1/50* | (2006.01) | |
| *H04B 1/48* | (2006.01) | |
| *H04L 25/02* | (2006.01) | |

(52) U.S. Cl.
CPC .............. *H03H 9/547* (2013.01); *H03H 9/542* (2013.01); *H03H 9/6409* (2013.01); *H04B 1/48* (2013.01); *H04B 1/50* (2013.01); *H04L 25/0278* (2013.01)
USPC ............. 333/133; 333/189; 333/193; 455/73; 455/83

(58) Field of Classification Search
CPC ..... H03H 9/542; H03H 9/547; H03H 9/6409; H04B 1/48; H04B 1/3833; H04B 1/50; H04L 25/0278
USPC ........................ 333/133, 189–196; 455/73, 83
See application file for complete search history.

(56) References Cited

U.S. PATENT DOCUMENTS

| 5,905,418 A | 5/1999 | Ehara et al. |
| 6,150,900 A * | 11/2000 | Kadota et al. ................. 333/133 |

(Continued)

FOREIGN PATENT DOCUMENTS

| DE | 10 2006 005298 A1 | 8/2007 |
| EP | 1804377 | 7/2007 |

(Continued)

OTHER PUBLICATIONS

Lorenz et al.; "Wide Bandwidth Low Cost SAW Notch Filters"; 1998 IEEE Ultrasonics Symposium Proceedings, vol. 1, pp. 51-55, Oct. 5-8, 1998.*

(Continued)

*Primary Examiner* — Barbara Summons
(74) *Attorney, Agent, or Firm* — Meyertons, Hood, Kivlin, Kowert & Goetzel, P.C.

(57) ABSTRACT

The present application describes a radio frequency band reject filter including an input port, an output port, a plurality of acoustic resonators and an inductor for matching the impedance of the plurality of acoustic resonators. The inductor is positioned within the band reject filter in respect of the plurality of acoustic resonators such that a static capacitance between the input port and the inductor is substantially equivalent to a static capacitance between the output port and the inductor. The plurality of acoustic resonators may be a plurality of parallel resonators, a plurality of series resonators or a combination of series and parallel resonators. The radio frequency band reject filter is fabricated using any of surface acoustic wave (SAW) technology, thin film bulk acoustic resonator (FBAR) technology, and bulk acoustic wave (BAW) technology.

21 Claims, 16 Drawing Sheets

(56) References Cited

U.S. PATENT DOCUMENTS

| | | | |
|---|---|---|---|
| 6,862,441 B2* | 3/2005 | Ella | 455/307 |
| 6,879,224 B2* | 4/2005 | Frank | 333/189 |
| 6,919,777 B2* | 7/2005 | Taniguchi et al. | 333/133 |
| 6,924,715 B2* | 8/2005 | Beaudin et al. | 333/133 |
| 6,943,645 B2* | 9/2005 | Taniguchi | 333/133 |
| 7,626,475 B2* | 12/2009 | Taniguchi | 333/195 |
| 7,876,178 B2* | 1/2011 | Tamura | 333/193 |
| 2006/0229030 A1* | 10/2006 | Simon et al. | 455/78 |
| 2007/0159274 A1 | 7/2007 | Onzuka | |
| 2007/0191055 A1* | 8/2007 | Kovacs et al. | 455/552.1 |
| 2008/0129411 A1* | 6/2008 | Beaudin et al. | 333/133 |
| 2009/0167459 A1* | 7/2009 | Jakob et al. | 333/129 |

FOREIGN PATENT DOCUMENTS

| | | |
|---|---|---|
| JP | 05-251987 A | 9/1993 |
| JP | 05-327483 A | 12/1993 |
| JP | 06-14454 A | 1/1994 |
| JP | 08-163019 A | 6/1996 |
| JP | 11-55047 A | 2/1999 |
| JP | 2007-202136 A | 8/2007 |
| WO | 2005/027535 A2 | 3/2005 |
| WO | WO 2006/045176 * | 5/2006 |

OTHER PUBLICATIONS

Jian et al.; "SAW Band Reject Filter Performance at 850 MHz"; 2005 IEEE Ultrasonics Symposium, vol. 4, pp. 2162-2165, Sep. 18-21, 2005.*

English translation of Patent Abstract of Japanese Patent No. 2007-202136, 1 page, Aug. 2007.

English translation of Patent Abstract of Japanese Patent No. 05-327483, 1 page, Dec. 1993.

English translation of Patent Abstract of Japanese Patent No. 11-055047, 1 page, Feb. 1999.

English translation of Patent Abstract of Japanese Patent No. 06-014454, 1 page, Jan. 1994.

English translation of Patent Abstract of Japanese Patent No. 08-163019, 1 page, Jun. 1996.

English translation of Patent Abstract of Japanese Patent No. 05-251987, 1 page, Sep. 1993.

Office Action, together with an English-language translation thereof, for corresponding Japanese Application No. 2011-533497, issued on Jul. 24, 2013, 8 pages.

International Search Report and Written Opinion for corresponding PCT Application No. PCT/CA2009/001564, May 3, 2011, 6 pages.

Lu Jianxian "Principle and Engineering Design of Mobile Communication Distribution System" (Chinese version), Mechanical Industry Press, Oct. 31, 2008, pp. 166-218.

Office Action from Chinese Patent Application No. 200980153420.0, mailed Jul. 30, 2013, (English Translation and Chinese Versions), pp. 1-31.

Beaudin S. et al., "A New SAW Band Reject Filter and Its Applications in Wireless Systems", 2002 IEEE Ultrasonics Symposium Proceedings, Muenchen, Germany, Oct. 8-11, 2002; [IEEE Ultrasonics Symposium Proceedings]. New York, NY, vol. 1, Nov. 8, 2002, pp. 147-151.

Hartmann C.S. et al., "SAW Notch Filters", IEEE 1987 Ultrasonics Symposium, 1987, pp. 131-138.

European Search Report from corresponding European Patent Application No. 09822951.1, Oct. 4, 2012, 12 pages.

English-language translation of the related portions of Lu Jianxian et al., "Principle and Engineering Design of Mobile Communication Distribution System", Mechanical Industry Press, 3 pages, Oct. 31, 2008.

* cited by examiner

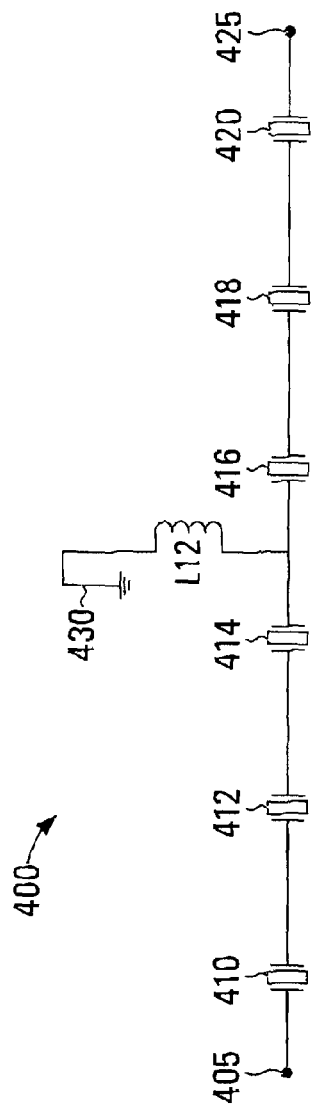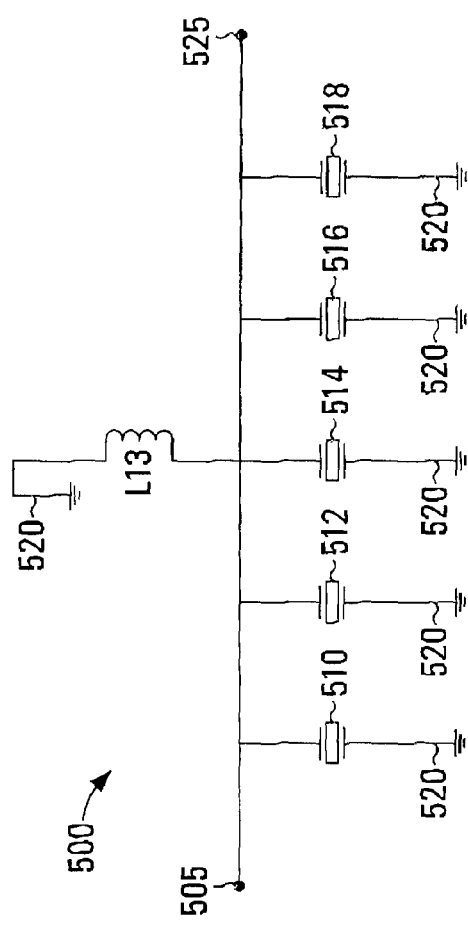
FIG. 4
FIG. 5

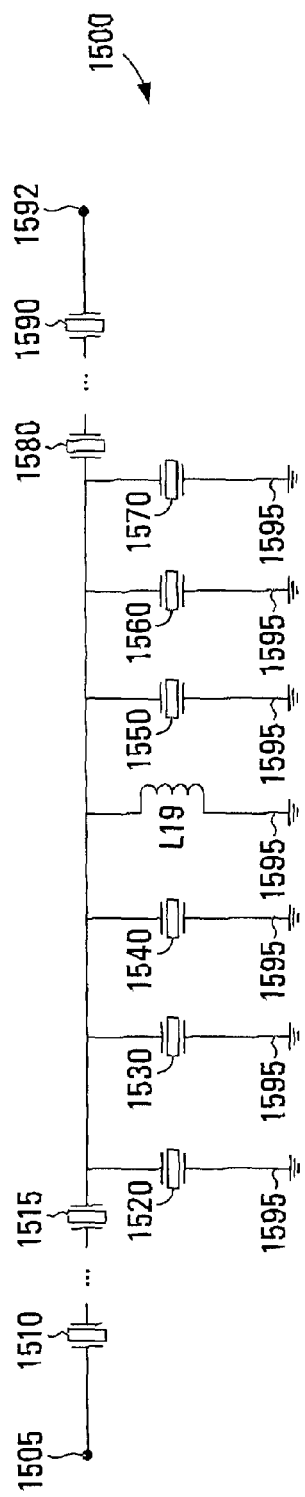
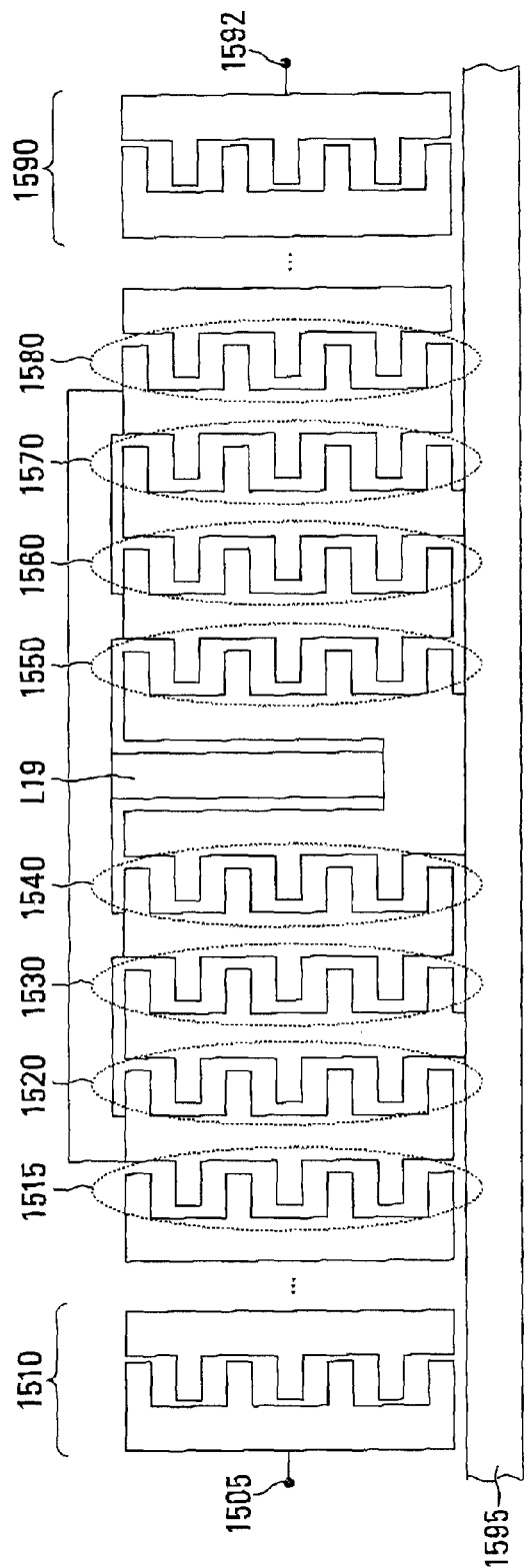
FIG. 15A
FIG. 15B

SELF-MATCHED BAND REJECT FILTER

RELATED APPLICATIONS

This application claims the benefit of and is a National Phase Entry of International Application Number PCT/CA2009/001564 filed Nov. 2, 2009, and claims the benefit of U.S. Provisional Patent Application No. 61/110,147 filed on Oct. 31, 2008, which are both hereby incorporated by reference in their entirety.

FIELD OF THE INVENTION

The invention relates to acoustic resonator band reject filters.

BACKGROUND OF THE INVENTION

There is a strong need in the telecommunications market, particularly in the area of 4 G wireless communication systems, as well as in existing wireless systems, for miniature type filters with improved performance from current levels. As 4 G systems target a very high speed data transfer, they need much wider bandwidth than existing systems such as GSM, CDMA and UMTS. On the other hand, limited frequency resources in 4 G systems require wireless carrier companies to set guard-bands as narrow as possible to enable maximum user capacity. Combining these two issues means that the 4 G wireless systems require miniature RF filters for their wireless terminal devices.

Due to their miniature size and low cost, acoustic materials-based RF filters such as surface acoustic wave (SAW), thin film bulk acoustic resonator (FBAR) and/or bulk acoustic wave (BAW) filters are widely used in compact and portable type terminal devices of various wireless systems. However, the current level of filter performance of these filters is still far from 4 G wireless system filter requirements.

Some non-acoustic microwave technology type filters, such as metal-type cavity filters or dielectric filters can be designed to meet filter performance requirements for these applications, but these types of designs have an ultra-high cost and result in physically large filters. As a result, metal-type cavity filters and dielectric filters are undesirable, particularly for applications in wireless terminals, for which size and weight are of considerable importance.

A lower cost and smaller size filter would be desirable for many purposes in communication systems.

SUMMARY OF THE INVENTION

According to an aspect of the present invention, there is provided a radio frequency band reject filter comprising: an input port; a plurality of acoustic resonators; an inductor for matching the impedance of the plurality of acoustic resonators; an output port; the inductor being positioned within the band reject filter in respect of the plurality of acoustic resonators such that a static capacitance between the input port and the inductor is substantially equivalent to a static capacitance between the output port and the inductor.

In some embodiments, the plurality of resonators is one of: a plurality of parallel resonators; a plurality of series resonators; and a combination of series and parallel resonators.

In some embodiments, the radio frequency band reject filter is fabricated using one of: surface acoustic wave (SAW) technology; thin film bulk acoustic resonator (FBAR) technology; and bulk acoustic wave (BAW) technology.

In some embodiments, the inductor is a short stub on-chip inductor.

In some embodiments, the inductance of the inductor is equal to or less than 0.1 nH.

In some embodiments, the radio frequency band reject filter is cascaded with one or more other radio frequency band reject filters.

In some embodiments, at least one of the one or more other radio frequency band reject filters has an inductor for matching impedance of the respective at least one other radio frequency band reject filters.

In some embodiments, the combination of series and parallel resonators comprises: N, where $N \geq 2$, series resonators; and M, where $M \geq 2$, parallel resonators.

In some embodiments, N is an even number and there are N/2 series resonators between the input port and the inductor and N/2 series resonators between the output port and the inductor.

In some embodiments, M is an even number and there are M/2 parallel resonators between the input port and the inductor and M/2 series resonators between the output port and the inductor.

In some embodiments, each series and parallel resonator is formed by a set of interdigital electrodes extending from a pair of parallel conductive elements.

In some embodiments, for the parallel resonators, at least one of the pair of parallel conductive elements is coupled to ground.

In some embodiments, for at least one series resonator or at least one parallel resonator, or both, at least one of the pair of parallel conductive elements forming the respective resonator is coupled to the inductor.

In some embodiments, the inductor is a short stub element located between the at least one of the pair of parallel conductive elements and ground.

In some embodiments, the inductance of the inductor can be fabricated accurately enough that external matching circuits are not used with the filter.

According to another aspect of the invention, there is provided a telecommunication base station comprising: at least one antenna; transmit circuitry configured for modulating one or more carrier signals having a desired transmit frequency or frequencies; receiving circuitry configured for receiving a radio frequency signal bearing information from one or more remote transmitters; a baseband processor configured for: processing a received signal received by the receiving circuitry; and configured for encoding a signal for transmission by the transmit circuitry; at least one of the transmit circuitry or receiving circuitry comprising the radio frequency band reject filter as described above or herein below.

According to another aspect of the invention, there is provided a telecommunication wireless terminal comprising: at least one antenna; transmit circuitry configured for modulating one or more carrier signals having a desired transmit frequency or frequencies; receiving circuitry configured for receiving a radio frequency signal bearing information from one or more remote transmitters; a baseband processor configured for: processing a received signal received by the receiving circuitry; and configured for encoding a signal for transmission by the transmit circuitry; at least one of the transmit circuitry or receiving circuitry comprising the radio frequency band reject filter as described above or herein below.

According to another aspect of the invention, there is provided a duplexer comprising the radio frequency band reject filter of as described above or herein below.

According to another aspect of the invention, there is provided a method of impedance matching during the fabrication of a radio frequency band reject filter comprising: fabricating an input port; fabricating a plurality of acoustic resonators; fabricating an inductor for matching the impedance of the plurality of acoustic resonators; fabricating an output port; wherein fabricating the inductor comprises positioning the inductor in the band reject filter in respect of the plurality of acoustic resonators such that a static capacitance between the input port and the inductor is substantially equivalent to a static capacitance between the output port and the inductor.

In some embodiments, fabricating the inductor comprises fabricating a short stub on-chip element that has a desired inductance.

In some embodiments, fabricating a short stub on-chip element that has a desired inductance comprises controlling at least one of the length, width, and thickness of the short stub on-chip element.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the invention will now be described with reference to the attached drawings in which:

FIG. 4 is a schematic illustration of an embodiment of a self-matched band reject filter;

FIG. 5 is a schematic illustration of another embodiment of a self-matched band reject filter;

FIG. 15A is a schematic illustration of a yet another embodiment of a self-matched band reject filter;

FIG. 15B is a representative illustration of an implementation of the self-matched band reject filter of FIG. 15A;

DETAILED DESCRIPTION OF THE EMBODIMENTS OF THE INVENTION

Figure 1:
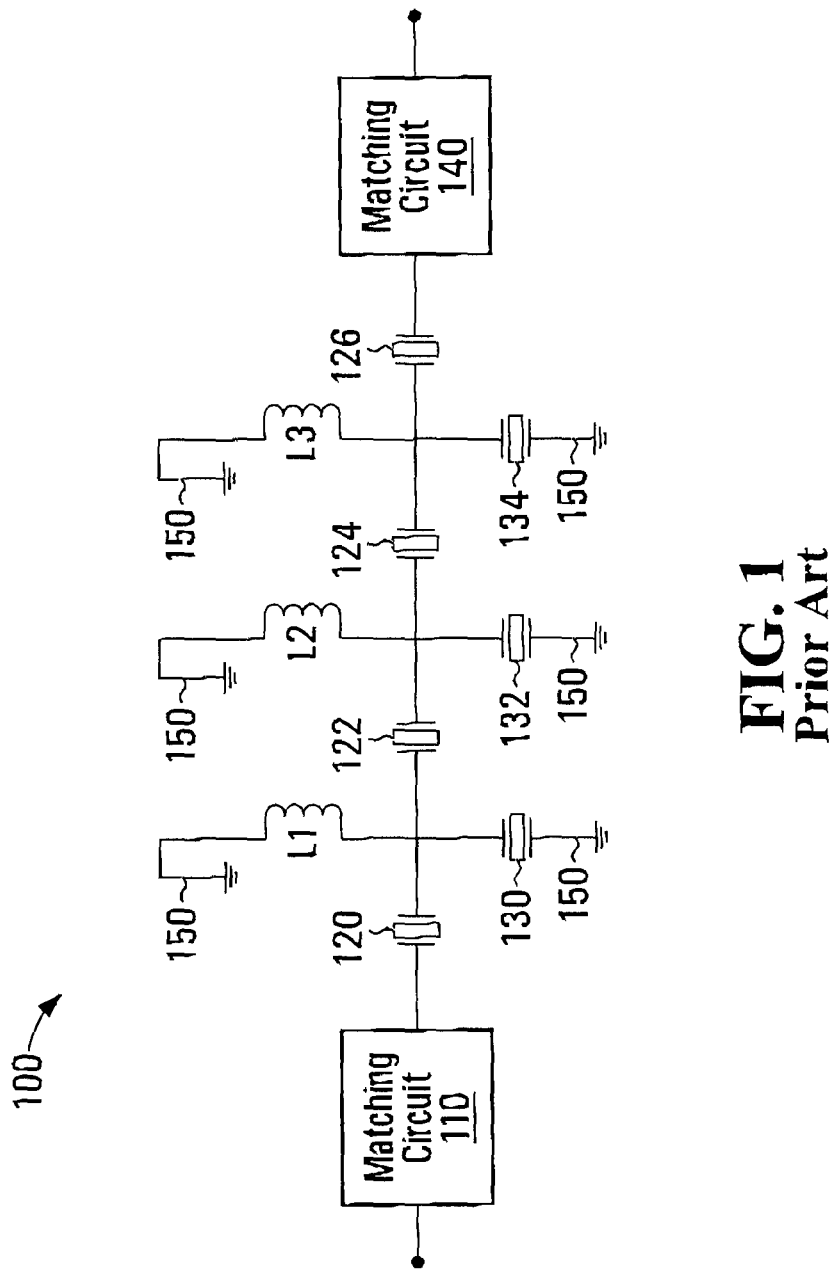
FIG. 1 is a schematic illustration of a conventional band reject filter.

Due to the desire for miniature sizing and low cost, surface acoustic wave (SAW), thin film bulk acoustic resonator (FBAR) and/or bulk acoustic wave (BAW) technology filters have became much utilized components in compact and portable type terminal devices for various modern wireless communication systems. Bandpass type and band-reject type filters can be designed using SAW, FBAR and BAW technologies.

An acoustic resonator-based ladder type band reject filter (BRF) usually needs a plurality of parallel inductors connected to the internal nodes of the filer for matching purpose. Also, if these internal matching inductors are not selected correctly, external matching circuits on both of input and output sides are necessary. Generally, such internal matching inductors have values over 2 nH and some of them could be as large or larger than 10 nH. A discrete component type inductor or printed circuit board (PCB) short stub type inductor is the common conventional choice to achieve this kind of internal matching.

However, in the real world, it is very difficult to find the correct inductance values for the internal matching on the PCB level, especially for a case that the BRF filter needs a plurality of parallel inductors for the internal matching. This may be due to the electromagnetic (EM) properties of a package body selected to house the BRF and bonding wires utilized to providing electrical coupling. In addition, the PCB itself may affect the values of such internal inductors. Also, when the operational frequency becomes larger than 2 GHz, the BRF itself becomes very small, and it is therefore unlikely that there is sufficient space for a plurality of such parallel type internal matching inductors as well as the input and output matching circuits surrounding the device.

One attempt to solve this problem is to directly make the short-stub transmission line on the die. However, as long as the value of the inductance is over 2 nH, any attempt of making an on-chip type short-stub inductor is impractical for actual device design, because an on-chip type inductor with such a value will require a huge footprint that could be 10 or more times bigger than the space occupied by the acoustic resonators of the BRF.

A technique is disclosed herein that allows internal matching inductors in a BRF device design to be in the range of 0.1 nH, which is a suitable value for the on-chip type short-stub inductor design. In some embodiments the dimension of the short-stub inductor in the range of 0.1 nH on a die containing a BRF can be of the same order as the acoustic resonator.

BRF devices can play a very important role in the RF front end of a wireless system for both a base station and a terminal device. It is a useful device for some wireless systems to aid in meeting power emission requirements or eliminate undesired signals such as the harmonic frequency signals and some spurious signals.

As the on-chip type short-stub inductor may be fabricated with the same accuracy as the acoustic resonator, the inductance value can be fabricated quite accurately, thus external input and output matching circuits may not be needed. Therefore, a self-matched and very small footprint BRF device becomes possible.

Due to the lack of a need for external input and output matching circuits on the PCB in some embodiments of the invention, the BRF may be easy to incorporate in some device implementations, such as wireless terminals and/or telecommunication base stations. Also, BRF devices can be used in a duplexer design that may provide improved power handling capability.

Some embodiments of the present invention can be applied to radio frequency (RF) band acoustic resonator-based BRF (Band Reject Filters), such as but not limited to those fabricated using surface acoustic wave (SAW), thin film bulk acoustic resonator (FBAR) and/or bulk acoustic wave (SAW) techniques. In some implementations, BRFs fabricated consistent with methods and devices disclosed herein are well suited for high frequency applications, for example over 1 GHz.

Some embodiments of the invention minimize the value of the single matching inductor L in a BRF design to a value that enables easier integration of the inductor into a BRF package design.

Some embodiments of the invention enable a high yield for mass-production, resulting in a potential reduced cost for fabricating the BRF device.

Referring to the drawings, FIG. 1 is a schematic circuit illustration of a conventional band reject filter. In FIG. 1, a BRF 100 is shown including a first matching circuit 110 at an input port of the BRF 100 and a second matching circuit 140 at an output port of the BRF 100. The BRF 100 includes multiple acoustic resonators 120, 122, 124, 126 in series, multiple acoustic resonators in parallel 130, 132, 134, and multiple discrete inductors L1, L2 L3.

Series resonator 120 is coupled to matching circuit 110 and a node to which inductor L1, parallel resonator 130 and series resonator 122 are coupled. Parallel resonator 130 and inductor L1 are connected to ground 150. Series resonator 122 is coupled to a node to which inductor L2, parallel resonator 132 and series resonator 124 are coupled. Parallel resonator 132 and inductor L2 are connected to ground 150. Series resonator 124 is coupled to a node to which inductor L3, parallel resonator 134 and series resonator 126 are coupled. Parallel resonator 134 and inductor L3 are connected to ground 150. Series resonator 126 is coupled to matching circuit 140.

In general, the values of L1, L2 and L3 are typically over 2 nH and thus it may not be practical to fabricate the inductors on-chip by using short-stub type microwave transmission line techniques because the dimension of a short-stub on-chip inductor for such an inductance value may be quite large. Other disadvantages of this type of matching for a band reject filter may include one or more of (1) a large number of inductors may be needed for matching the overall filter; and (2) external matching circuits for both input and output ports may be needed, as shown in FIG. 1.

Figure 2A:
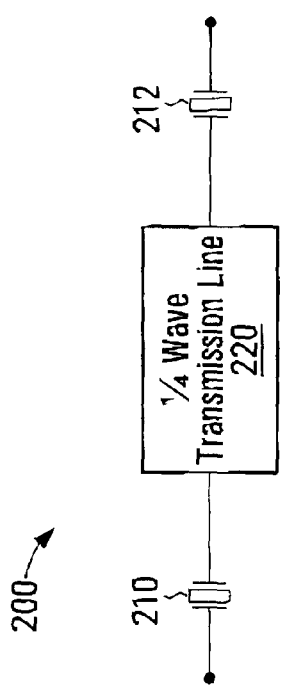
FIGS. 2A and 2B are schematic illustrations of additional conventional band reject filters.
Figure 2B:
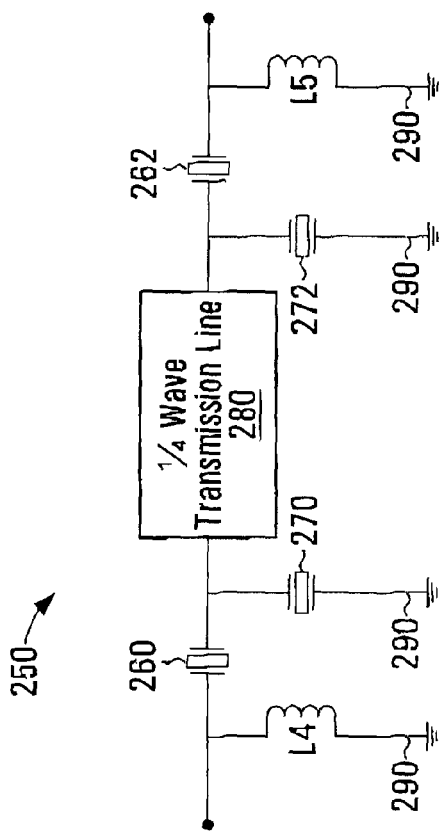

FIGS. 2A and 2B are schematic circuit illustrations of additional conventional band reject filters. In FIG. 2A, a BRF 200 includes two series resonators 210 and 212 coupled together via a ¼ wave transmission line 220. In FIG. 2S, a BRF 250 includes two series resonators 260 and 262 coupled together via a ¼ wave transmission line 280 as well as two parallel resonators 270 and 272 located between the respective series resonators 260 and 262 and the ¼ wave transmission line 280. Inductors L4 and L5 are located prior to series resonator 160 on the input port side of BRF 250 and subsequent to series resonator 162 on the output port side of BRF 250, respectively.

Some disadvantages of such an impedance matching method may be: (1) a ¼ wave transmission line for some frequencies may be too long for on-chip design; (2) a large number of inductors may be needed for matching the overall filter; and (3) inductors may have large inductance values and consequently may be difficult to integrate onto the chip.

Figure 3A:
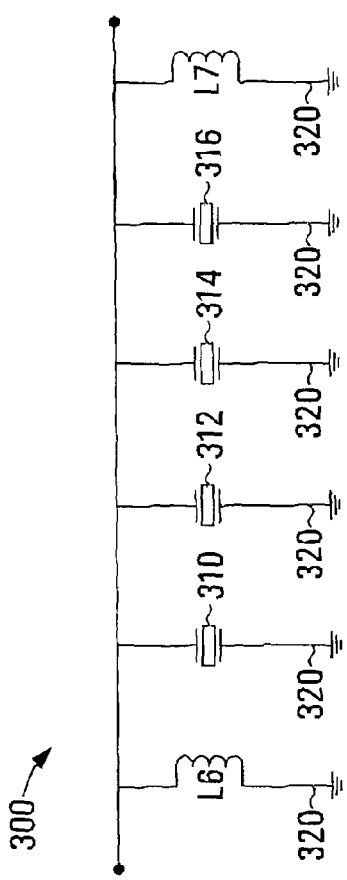
FIGS. 3A and 3B are schematic illustrations of further conventional band reject filters.
Figure 3B:
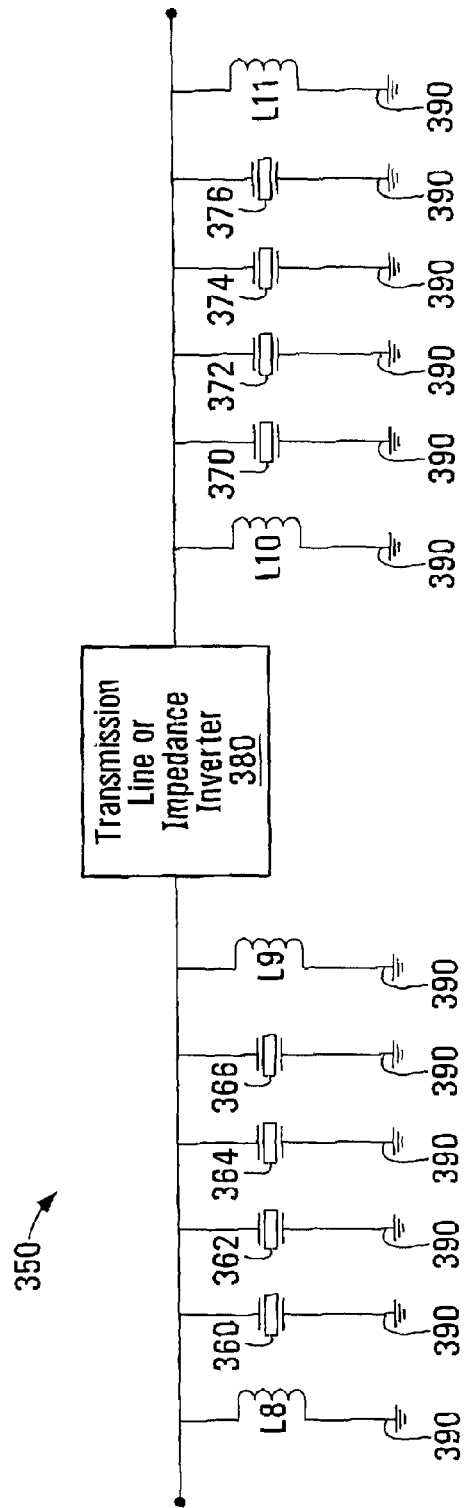

FIGS. 3A and 3B are schematic circuit illustrations of yet another conventional band reject filter. In FIG. 3A, a BRF 300 includes four parallel resonators 310, 312, 314, 316 and inductors L6 and L7 located prior to series resonator 310 on the input port side of BRF 300 and subsequent to series resonator 316 on the output port side of BRF 300. In FIG. 3B, a BRF 350 includes a first inductor L8 at an input port side of BRF 350 followed by four parallel resonators 360, 362, 364, 366 and a second inductor L9. The four parallel resonators 360, 362, 364, 366 and first and second inductors L8 and L9 are also coupled to ground 300. A transmission line or impedance inverter 380 is coupled to the second inductor L9. A third inductor L10 is coupled to transmission line 380. Four more parallel resonators 370, 372, 374, 376 are coupled to third inductor L10. A fourth inductor L11 is coupled to the four parallel resonators on the output port side of the BRF 350. The four parallel resonators 370, 372, 374, 376 and third and fourth inductors L10 and L11 are also coupled to ground 300.

Some of the disadvantages of this third type of impedance matching are similar to disadvantages of the previously described examples. Some of the disadvantages may include: (1) too many inductors may be needed for matching; (2) inductors may have large inductance values and consequently may be difficult to integrate onto the chip; (3) a ¼ wave transmission line for some frequencies may be too long for on-chip design; and (4) the designs of FIGS. 3A AND 3B utilize only parallel, also known as shunt, resonators, thus it may be difficult to achieve a high performance BRF.

FIG. 4 is a schematic circuit illustration of an embodiment of a self-matched BRF according to the present invention. In FIG. 4, a BRF 400 is comprised of a total of six series acoustic resonators 410, 412, 414, 416, 418, 420 and a single internal matching inductor L12. Inductor L12 is coupled to ground 430 as well. The BRF 400 is also considered to have an input port 405 and an output port 425. In the example of FIG. 4, the single matching inductor L12 is located at a "midpoint" of the six series resonators. There are three series resonators on between the matching inductor L12 and the input port 405 and the matching inductor L12 and the output port 425. Inductor L12 is coupled to ground 430. For the purposes of this application, the expression "coupled to ground" is used in the sense that each circuit element "coupled to ground" has two ports, a first port which is coupled to a given location in a circuit and the other port which is "coupled to ground".

In some embodiments an inductor is utilized to match a plurality of series resonators as long as the total static capacitances of resonators on each side of inductor L12 i.e. between the inductor L12 and the input port 405 and between the inductor L12 and the output port 425, are close to equivalent in value. Therefore in some embodiments, the number of resonators on each side of the parallel inductor does not have to be equal, but the static capacitance should be close to equivalent in value. The BRF design of this embodiment minimizes the number of matching inductors. Reducing the number of matching inductors may improve rejection performance.

In some embodiments of the invention a single inductor is capable of impedance matching the BRF due to the manner in which the single inductor is fabricated in conjunction with the acoustic resonators that collectively form the BRF. Examples of this will be shown in greater detail in FIGS. 8B to 15B.

While the specific example of FIG. 4 illustrates six series resonators in the BRF, it is to be understood that the particular number of resonators that are included in the BRF is specific to the implementation, and is not to be limited to the example case of six resonators.

FIG. 5 is a schematic circuit illustration of another embodiment of a self-matched BRF. In FIG. 5, BRF 500 is comprised of a total of five parallel acoustic resonators 510, 512, 514, 516, 518 and an internal matching inductor L13. Inductor L13 and the five parallel resistors are coupled to ground 520 as well. The BRF 500 is also considered to have an input port 505 and an output port 525.

In some embodiments a single parallel inductor is utilized to match a plurality of parallel resonators as long as the total static capacitance of resonators on each side of inductor L13 are close to equivalent in value.

While the specific example of FIG. 5 illustrates five parallel resonators in the BRF, it is to be understood that the particular number of resonators that are included in the BRF of such an implementation is specific to the implementation.

Figure 6:
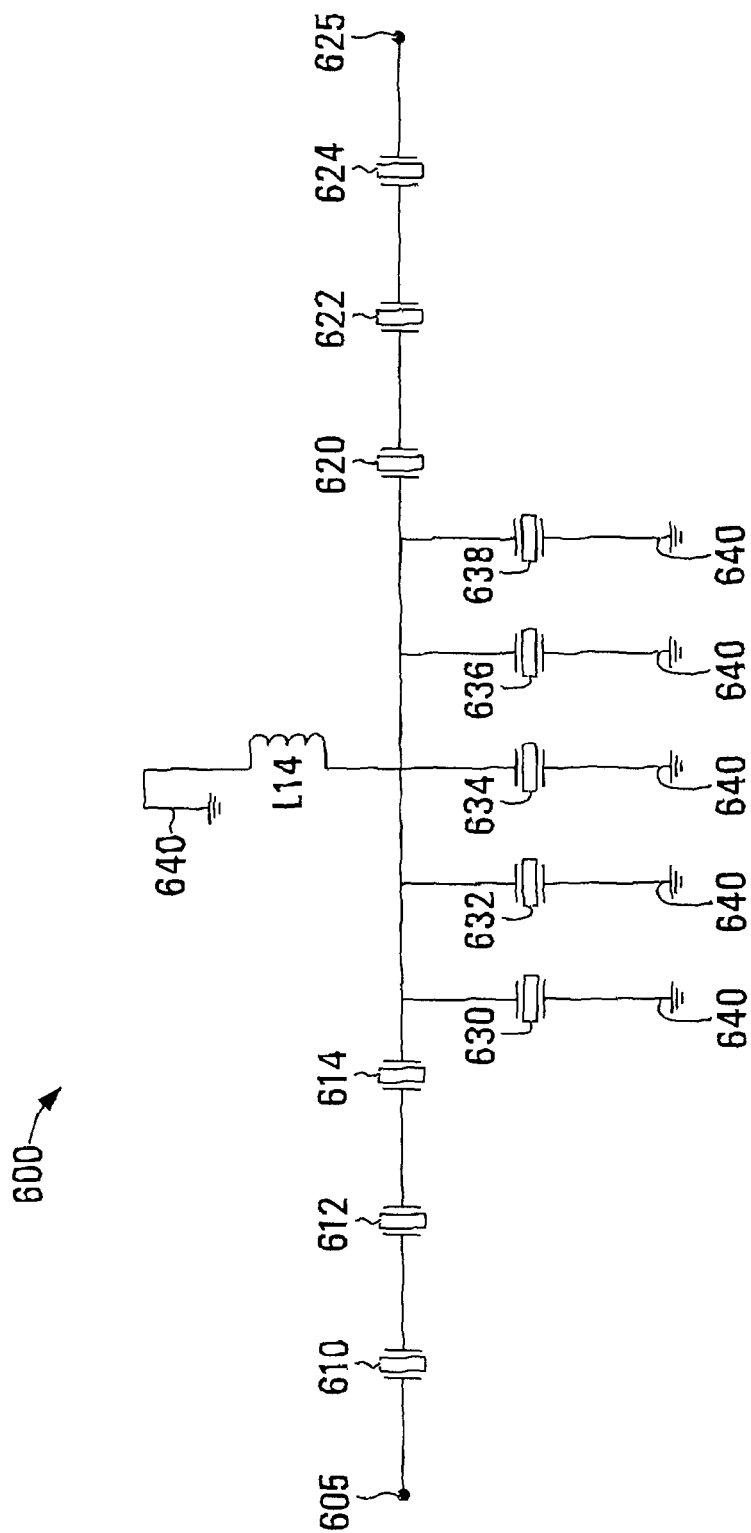
FIG. 6 is a schematic illustration of a further embodiment of a self-matched band reject filter.

FIG. 6 is a schematic circuit illustration of a third embodiment of a self-matched radio frequency band BRF. FIG. 6 illustrates a BRF 600 having an input port 605 and an output port 625. The BRF 600 includes a first group of three series resonators 610, 612, 614 on an input port side of BRF 600 and a second group of three series resonators 620, 622, 624 on an output port side of BRF 600. Located between the first and second groups of series resonators is a third group of resonators that is similar to BRF 500 of FIG. 5. The third group of resonators includes a group of five parallel resonators 630, 632, 634, 636 and 638 and a matching internal inductor L14. Each of the five parallel resistors and inductor L14 are also coupled to ground 640.

In some embodiments, the BRF needs only a single inductor for matching a large number of series and/or parallel resonators. In some embodiments, the BRF does not need external matching circuits at the input and output ports. In some embodiments, the parallel inductance can be minimized to be as small as 0.1 nH, which is a value that can be easily integrated onto the BRF package design, for example for a printed circuit board (PCB) device. In some embodiments the self matching BRF device has a very small size, for example 2 mm² at an operation frequency of 5.6 GHz.

Figure 7A:
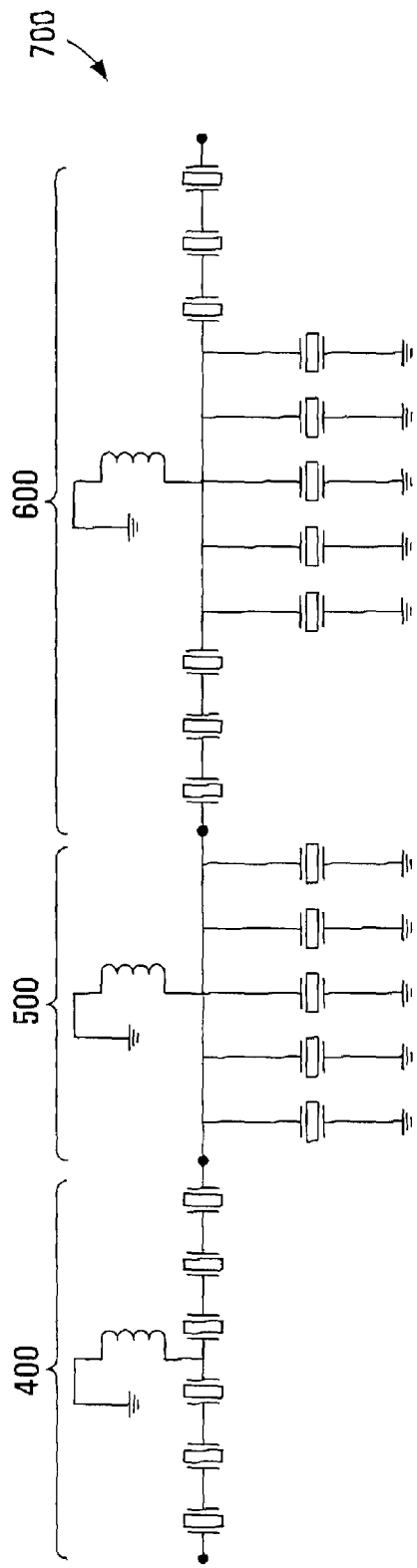
FIGS. 7A and 7B are schematic illustrations of further embodiments of a self-matched band reject filter.
Figure 7B:
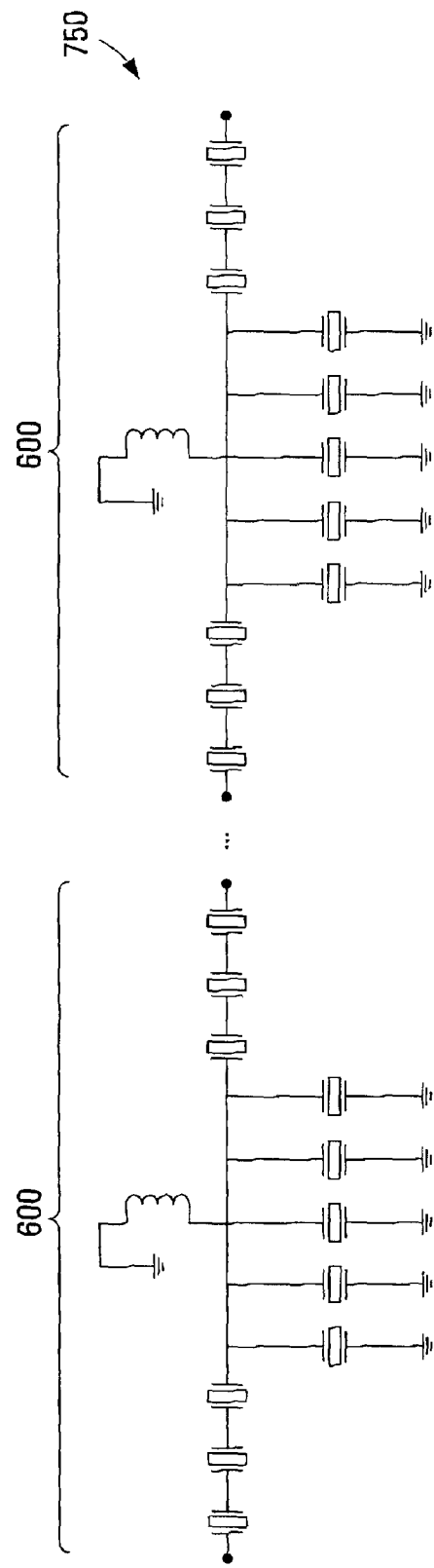

FIGS. 7A and 7B are schematic circuit illustrations of a further embodiment of a self-matched band reject filter. FIGS. 7A and 7B show examples of cascading multiple BRFs. FIG. 7A illustrates a first example of a BRF 700, which includes BRFs 400, 500 and 600, from FIGS. 4, 5 and 6, respectively, cascaded together. FIG. 7B illustrates a second example of a BRF 750, which includes multiple BRFs, corresponding to BRF 600 of FIG. 6, cascaded together.

FIGS. 7A and 7B are merely two examples of how self-matched BRFs may be cascaded together. In particular the two examples shown are a first example in which different structural types of BRFs are being cascaded together to form a BRF with a different set of operational parameters than any of the individual BRFs and a second example in which two or more BRFs having a same structure, but not necessarily the same operating parameters for the elements in the structures, are cascaded together. It is to be understood that multiple self-matched BRFs, which are internally matched according to aspects of the invention disclosed herein, may be cascaded together. The specific number of BRFs, the orientation of the BRFs, and the properties and/or parameters of the particular components in the BRFs, are all implementation specific.

Figure 8A:
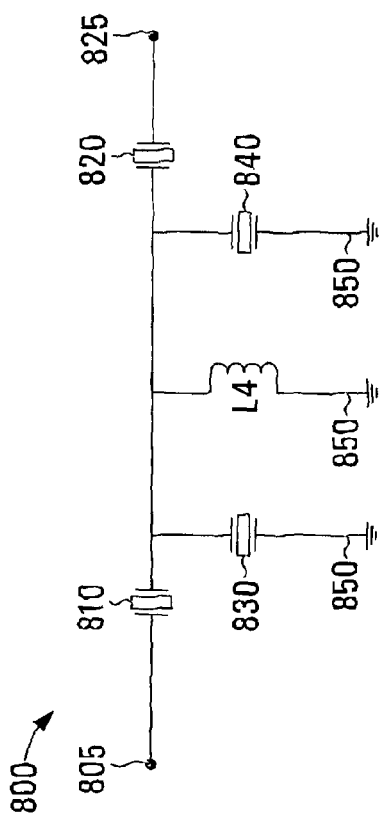
FIG. 8A is a schematic illustration of yet another embodiment of a self-matched band reject filter.

FIG. 8A is a schematic circuit illustration of another embodiment of a self-matched band reject filter. In FIG. 8A, BRF 800 is considered to have an input port 805 and an output port 825. BRF 800 includes a single series resonator 810 and a single parallel resonator 830 on an input port side of the BRF 800, which are coupled to a matching inductor L15. A single parallel resonator 840 and a single series resonator 820 on an output port side of the BRF 800 are coupled to the matching inductor L15. The two parallel resonators 830 and 840 and the matching inductor L15 are also coupled to ground 850.

Figure 8B:
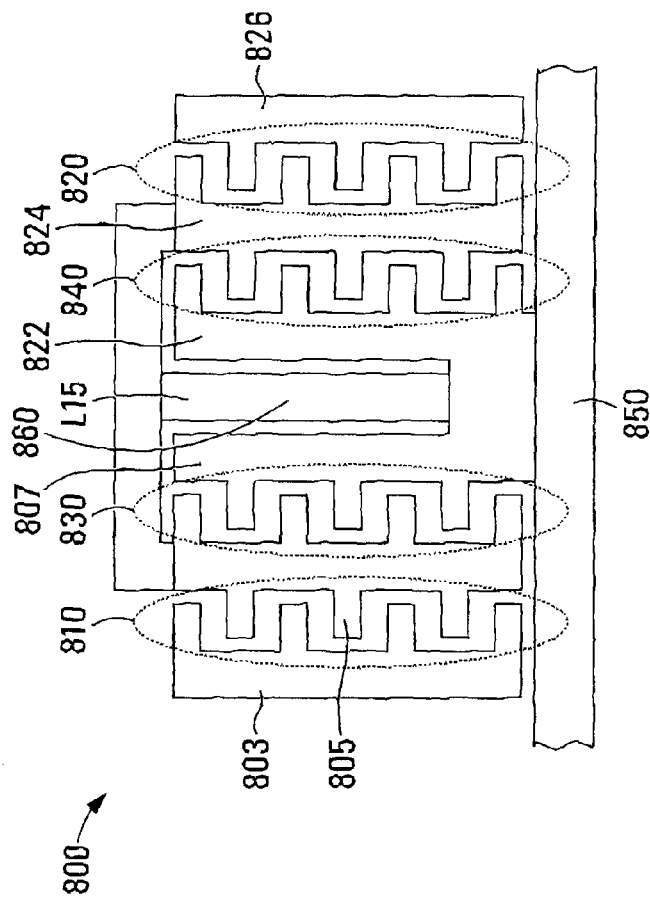
FIG. 8B is a representative illustration of an implementation of the self-matched band reject filter of FIG. 8A.

FIG. 8B is a representative illustration of an implementation of BRF 800 of FIG. 8A as an acoustic resonator interdigital transducer. Each resonator of the series resonators and the parallel resonators of FIG. 8A includes a plurality of consecutive interdigital transducer electrodes. Series resonator 810 is formed by electrodes of transducer element 803 and a first set of electrodes of transducer element 805. Series resonator 820 is formed by electrodes of transducer element 826 and a first set of electrodes of transducer element 824. Parallel resonator 830 is formed by electrodes of transducer element 807 and a second set of electrodes of transducer element 805. Parallel resonator 840 is formed by electrodes of transducer element 822 and a second set of electrodes of transducer element 824. Element 860 of the transducer is a short stub component that provides the desired inductance for inductor L15. Element 850 of the transducer is a ground bar.

In some embodiments of the invention the thickness, width and length of transducer element 860 are controlled during fabrication of the BRF to control the value of the inductance of inductor L15.

Figure 9A:
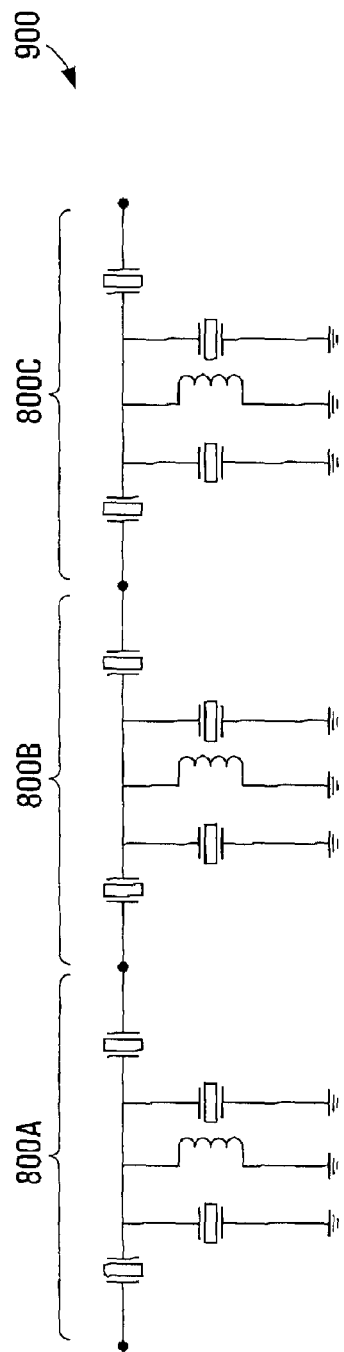
FIG. 9A is a schematic illustration of a further embodiment of a self-matched band reject filter.

FIG. 9A is a schematic circuit illustration of another embodiment of a self-matched band reject filter. FIG. 9A shows an example of cascading multiple BRFs. FIG. 9A illustrates a BRF 900 that includes three BRFs 800A, 800B, 800C cascaded together. These three BRFs substantially correspond to the structure of BRF 800 of FIG. 8A. As described above, while the structure of the elements of BRFs 800A, 800B, 800C may be substantially the same as that of BRF 800, the physical parameters of the various elements is not necessarily the same.

Figure 9B:
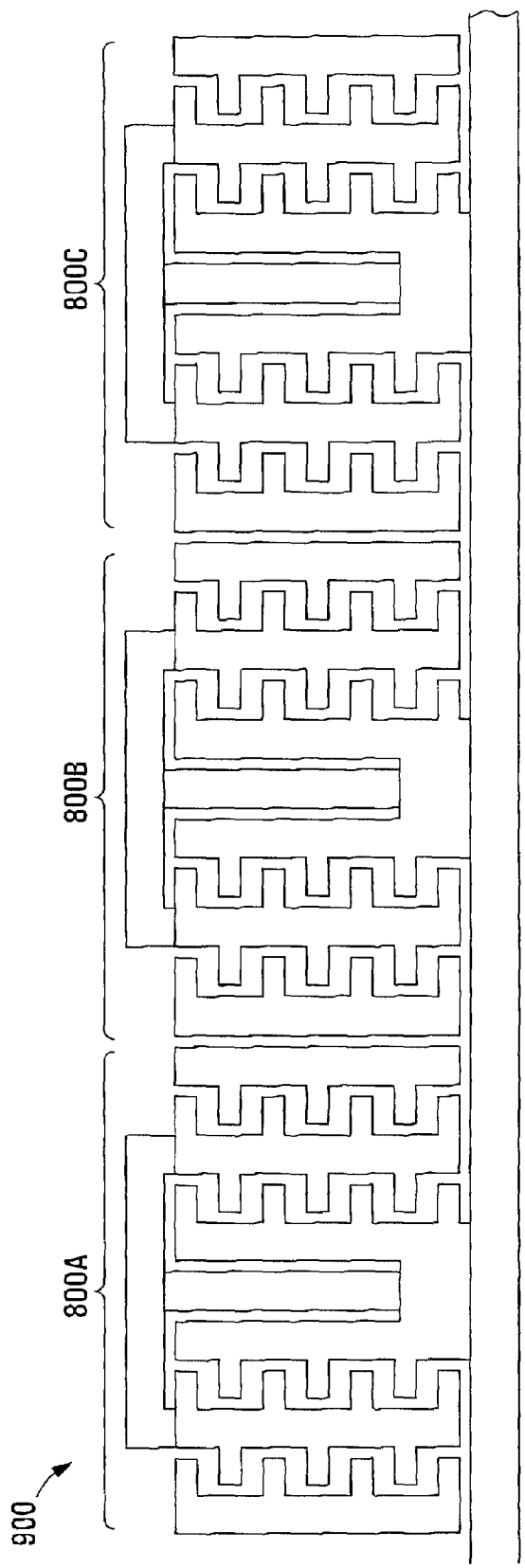
FIG. 9B is a representative illustration of an implementation of the self-matched band reject filter of FIG. 9A.

FIG. 9B is a representative illustration of an implementation of BRF 900 of FIG. 9A as an acoustic resonator interdigital transducer. Three transducers 800A, 800B, 800C of the type illustrated in FIG. 8B are shown.

Although only three cascaded BRFs are shown in FIGS. 9A and 9B, the specific number of cascaded BRFs is implementation specific. Furthermore, while three BRFs of the same structure are cascaded together, it is to be understood that when multiple BRFs are cascaded together to form a new BRF, the multiple BRFs can be the same structure, with similar or different parameters, or can be different structures.

Figure 10A:
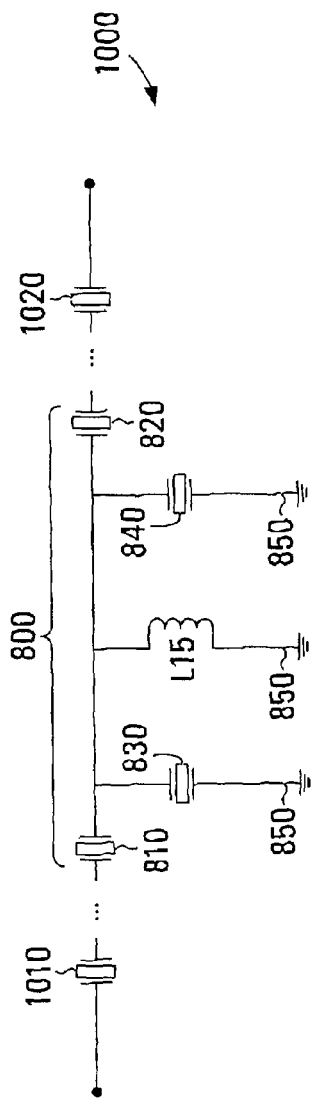
FIG. 10A is a schematic illustration of yet a further embodiment of a self-matched band reject filter.

FIG. 10A is a schematic circuit illustration of a further embodiment of a self-matched band reject filter. In FIG. 10A, a BRF 1000 includes a portion of the BRF 1000 that is similar to the structure of BRF 800 of FIG. 8A. The numbering from FIG. 8A has been maintained in FIG. 10A for convention purposes. Multiple series resonators 1010, only one being shown, are coupled to an input side of the portion that is similar to BRF 800. Multiple series resonators 1020, only one being shown, are coupled to the output side of the portion that is similar to BRF 800.

Figure 10B:
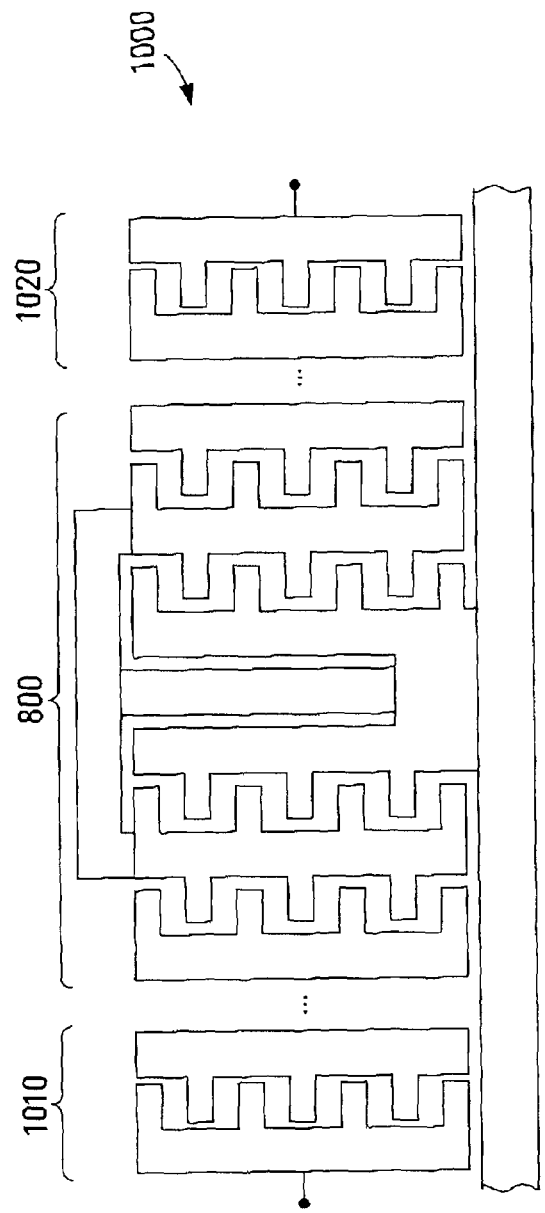
FIG. 10B is a representative illustration of an implementation of the self-matched band reject filter of FIG. 10A.

FIG. 10B is a representative illustration of an implementation of BRF 1000 of FIG. 10A as an acoustic resonator interdigital transducer. A transducer similar to 800 of FIG. 8B is shown together with additional series resonator elements 1010 and 1020.

In some embodiments the use of connection bus bars can be minimized resulting in a compact size of the BRF. For example, this may include controlling any of the length, width and thickness of transducer elements that for the BRF.

Figure 11A:
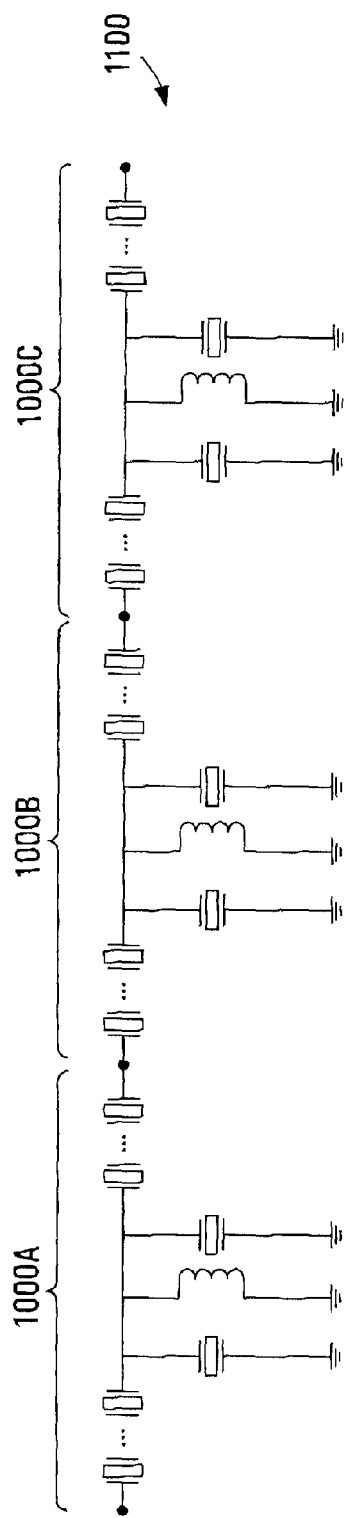
FIG. 11A is a schematic illustration of another embodiment of a self-matched band reject filter.

FIG. 11A is a schematic circuit illustration of a further embodiment of a self-matched band reject filter. In FIG. 11A, a BRF 1100 includes three cascaded portions 1000A, 1000B, 1000C that are similar to BRF 1000 of FIG. 10A.

Figure 11B:
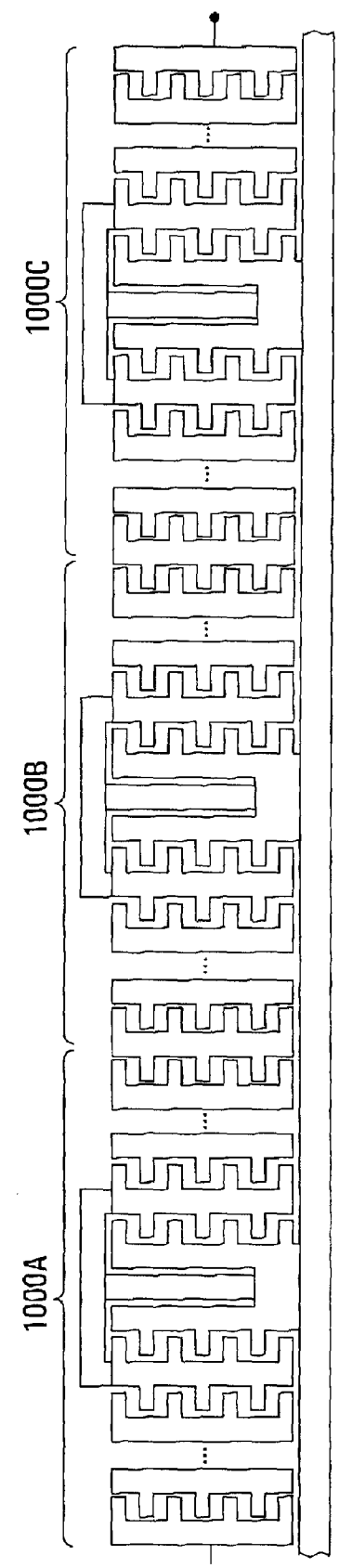
FIG. 11B is a representative illustration of an implementation of the self-matched band reject filter of FIG. 11A.

FIG. 11B is a representative illustration of an implementation of BRF 1100 of FIG. 11A as an acoustic resonator interdigital transducer. Three transducers 1000A, 1000B, 1000C of the type illustrated in FIG. 10B are shown.

In some embodiments the use of connection bus bars can be minimized resulting in a compact size of the BRF. In some embodiments such a cascaded design enables enhanced BRF performance.

Figure 12A:
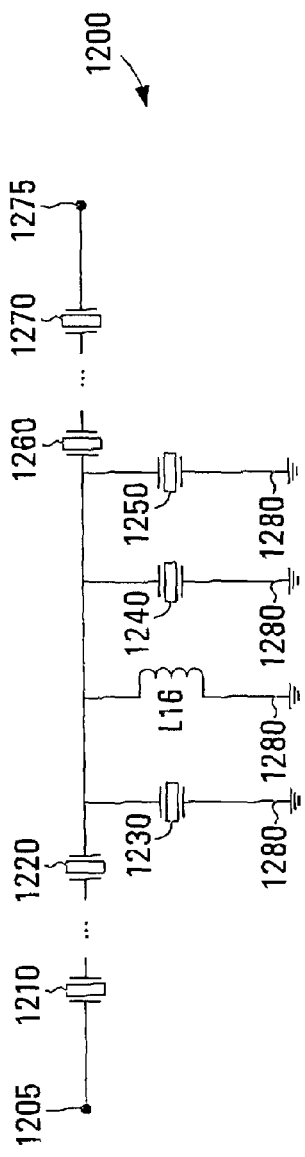
FIG. 12A is a schematic illustration of a further embodiment of a self-matched band reject filter.

FIG. 12A is a schematic circuit illustration of a further embodiment of a self-matched band reject filter. In FIG. 12A, BRF 1200 is considered to have an input port 1205 and an output port 1275. BRF 1200 includes a first series resonator 1210 and a second series resonator 1220 of multiple series resonators on an input port side of BRF 1200. A first parallel resonator 1230 is coupled to the second series resonator 1220. A matching inductor L16 is coupled to the first parallel resonator 1230. A second parallel resonator 1240 and a third parallel resonator 1250 are coupled to the matching inductor L16. Third series resonator 1260 and fourth series resonator 1270 of multiple series resonators on an output port side of BRF 1200 are coupled to the third parallel resonator 1250. The three parallel resonators 1230, 1240 and 1250 and the matching inductor L16 are also coupled to ground 1280.

Figure 12B:
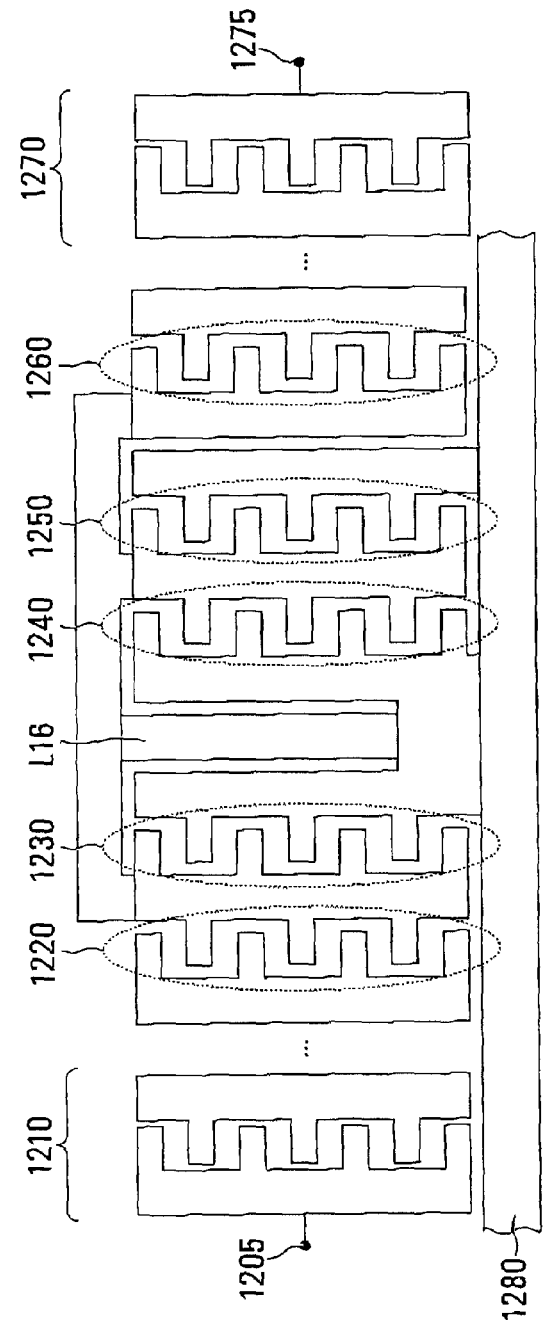
FIG. 12B is a representative illustration of an implementation of the self-matched band reject filter of FIG. 12A.

FIG. 12B is a representative illustration of an implementation of BRF 1200 of FIG. 12A as an acoustic resonator interdigital transducer. Elements for implementing the first, second, third and fourth series resonators 1210, 1220, 1260 and 1270 and first, second and third parallel resonators 1230, 1240 and 1250 as well as matching inductor L16 are shown.

In some embodiments the use of connection bus bars can be minimized resulting in a compact size of the BRF. For example, this may include controlling any of the length, width and thickness of transducer elements that for the BRF.

Figure 13A:
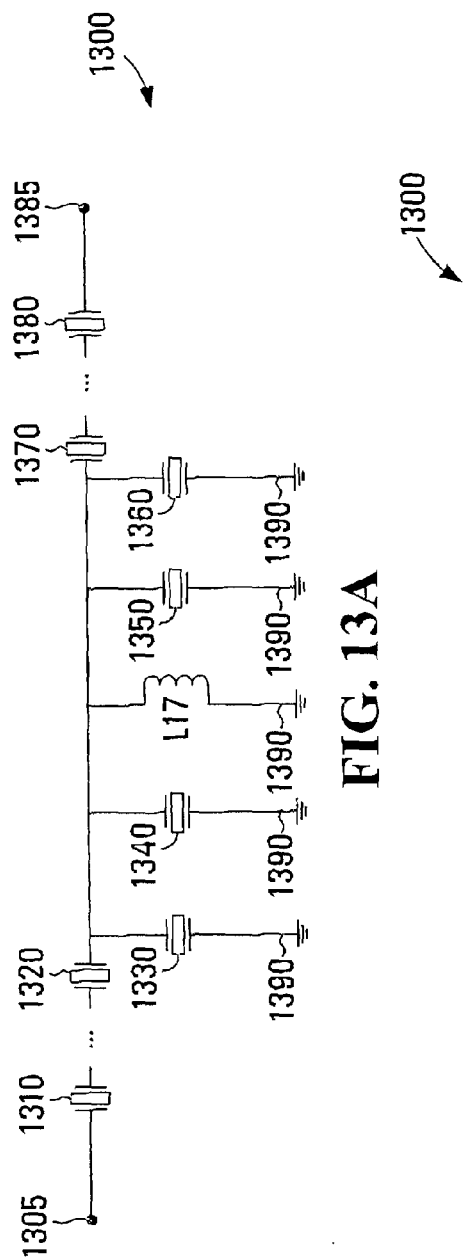
FIG. 13A is a schematic illustration of another embodiment of a self-matched band reject filter.

FIG. 13A is a schematic circuit illustration of a further embodiment of a self-matched band reject filter. In FIG. 13A, BRF 1300 is considered to have an input port 1305 and an output port 1385. BRF 1300 includes a first series resonator 1310 and a second series resonator 1320 of multiple series resonators on an input port side of BRF 1300. A first parallel resonator 1330 and a second parallel resonator 1340 are coupled to the second series resonator 1320. A matching inductor L17 is coupled to the second parallel resonator 1340. A third parallel resonator 1350 and a fourth parallel resonator 1360 are coupled to the matching inductor L17. Third series resonator 1370 and fourth series resonator 1380 of multiple series resonators on an output port side of BRF 1300 are coupled to the fourth parallel resonator 1360. The four parallel resonators 1330, 1340, 1350 and 1360 and the matching inductor L16 are also coupled to ground 1390.

Figure 13B:
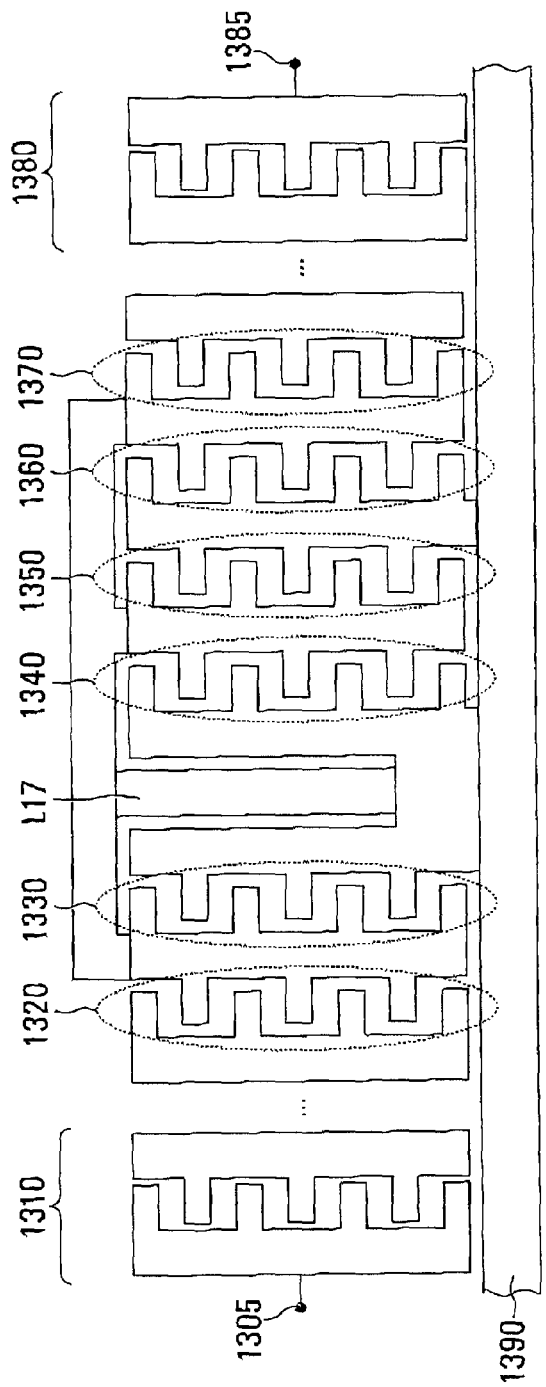
FIG. 13B is a representative illustration of an implementation of the self-matched band reject filter of FIG. 13A.

FIG. 13B is a representative illustration of an implementation of BRF 1300 of FIG. 13A as an acoustic resonator interdigital transducer. Elements for implementing the first, second, third and fourth series resonators 1310, 1320, 1370 and 1380 and first, second, third and fourth parallel resonators 1330, 1340, 1350 and 1360 as well as matching inductor L17 are shown.

In some embodiments the use of connection bus bars can be minimized resulting in a compact size of the BRF. For example, this may include controlling any of the length, width and thickness of transducer elements that for the BRF.

Figure 14A:
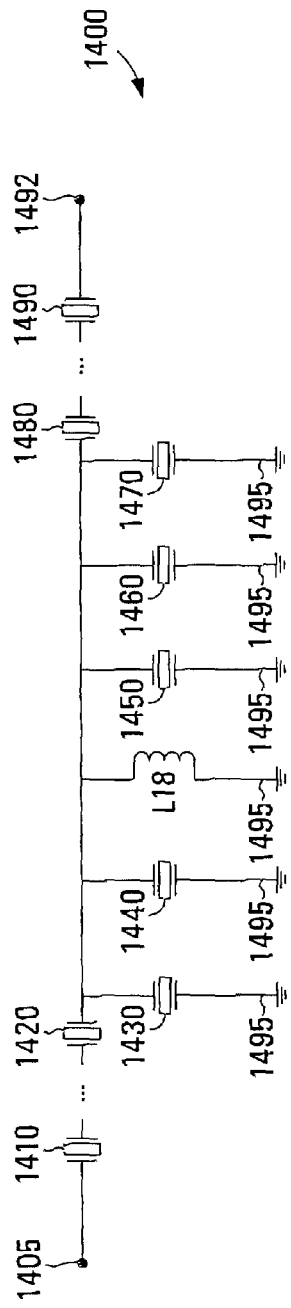
FIG. 14A is a schematic illustration of a further embodiment of a self-matched band reject filter.

FIG. 14A is a schematic circuit illustration of a further embodiment of a self-matched band reject filter. In FIG. 14A, BRF 1400 is considered to have an input port 1405 and an output port 1492. BRF 1400 includes a first series resonator 1410 and a second series resonator 1420 of multiple series resonators on an input port side of BRF 1400. A first parallel resonator 1430 and a second parallel resonator 1440 are coupled to the second series resonator 1420. A matching inductor L18 is coupled to the second parallel resonator 1440. A third parallel resonator 1450, a fourth parallel resonator 1460 and a fifth parallel resonator 1470 are coupled to the matching inductor L18. Third series resonator 1480 and fourth series resonator 1490 of multiple series resonators on an output port side of BRF 1400 are coupled to the fifth parallel resonator 1470. The five parallel resonators 1430, 1440, 1450, 1460 and 1470 and the matching inductor L18 are also coupled to ground 1495.

Figure 14B:
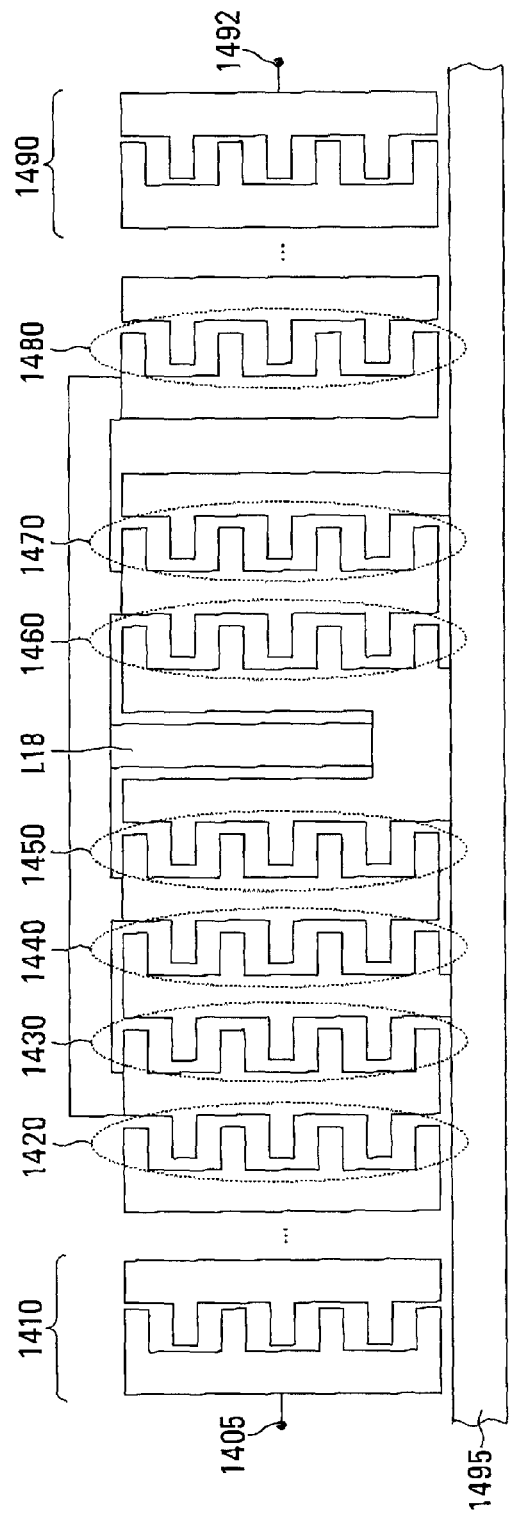
FIG. 14B is a representative illustration of an implementation of the self-matched band reject filter of FIG. 14A.

FIG. 14B is a representative illustration of an implementation of BRF 1400 of FIG. 14A as an acoustic resonator interdigital transducer. Elements for implementing the first, second, third and fourth series resonators 1410, 1420, 1480 and 1490 and first, second, third, fourth and fifth parallel resonators 1430, 1440, 1450, 1460 and 1470 as well as matching inductor L18 are shown.

In some embodiments the use of connection bus bars can be minimized resulting in a compact size of the BRF. For example, this may include controlling any of the length, width and thickness of transducer elements that for the BRF.

FIG. 15A is a schematic circuit illustration of a further embodiment of a self-matched band reject filter. In FIG. 15A, BRF 1500 is considered to have an input port 1505 and an output port 1592. BRF 1500 includes a first series resonator 1510 and a second series resonator 1515 of multiple series resonators on an input port side of BRF 1500. A first parallel resonator 1520, a second parallel resonator 1530 and a third parallel resonator 1540 are coupled to the second series resonator 1515. A matching inductor L19 is coupled to the third parallel resonator 1540. A fourth parallel resonator 1550, a fifth parallel resonator 1560 and a sixth parallel resonator 1570 are coupled to the matching inductor L19. Third series resonator 1580 and fourth series resonator 1590 of multiple series resonators on an output port side of BRF 1500 are coupled to the sixth parallel resonator 1570. The six parallel resonators 1520, 1530, 1540, 1550, 1560 and 1570 and the matching inductor L19 are also coupled to ground 1595.

FIG. 15B is a representative illustration of an implementation of BRF 1500 of FIG. 15A as an acoustic resonator interdigital transducer. Elements for implementing the first, second, third and fourth series resonators 1510, 1515, 1580 and 1590 and first, second, third, fourth, fifth and sixth parallel resonators 1520, 1530, 1540, 1550, 1560 and 1570 as well as matching inductor L19 are shown.

In some embodiments the use of connection bus bars can be minimized resulting in a compact site of the BRF. For example, this may include controlling any of the length, width and thickness of transducer elements that for the BRF.

By using saw, FBAR and/or BAW design technologies, some embodiments of the invention result in economically low cost devices having a compact physical size.

Some aspects of the invention may find uses in applications such as U.S. patent application Ser. No. 12/424,068 filed Apr. 15, 2009, assigned to the assignee of the present application.

According to a broad aspect of the invention, a radio frequency band reject filter (BRF) includes an input port and an output port. The radio frequency BRF includes a plurality of acoustic resonators and an inductor for matching the impedance of the plurality of acoustic resonators. The inductor is positioned in the BRF in respect of the plurality of acoustic resonators such that a static capacitance between the input port and the inductor is substantially equivalent to a static capacitance between the output port and the inductor.

In some embodiments, the four acoustic resonators are one of: a plurality of parallel resonators; a plurality of series resonators; and a combination of series and parallel resonators.

In some embodiments, the combination of series and parallel resonators comprise: N, where N≥2, series resonators; and M, where M≥2, parallel resonators.

In some implementations when N is an even number, there are N/2 series resonators between the input port and the inductor and N/2 series resonators between the output port and the inductor.

In some embodiments, when M is an even number there are M/2 parallel resonators between the input port and the inductor and M/2 series resonators between the output port and the inductor.

In some embodiments, each series and parallel resonator that is part of a BRF is part of a transducer formed by a set of interdigital electrodes extending from a pair of parallel conductive elements.

In some embodiments, in the case of the parallel resonators, at least one of the pair of parallel conductive elements is coupled to ground.

In some embodiments, when at least one series resonator or at least one parallel resonator, or both, are coupled to at least one of the pair of parallel conductive elements, the at least one conductive element is coupled to a inductor.

In some embodiments the inductor is a short stub element located between the at least one of the pair of parallel conductive elements and ground.

In some embodiments the inductor is equal to or less than 0.1 nH.

In some embodiments the BRF is one of multiple radio frequency BRFs cascaded together with other radio frequency BRFs.

In some embodiments, some or all of the other BRFs each have a single inductor for matching the impedance of the respective radio frequency BRFs.

Figure 16:
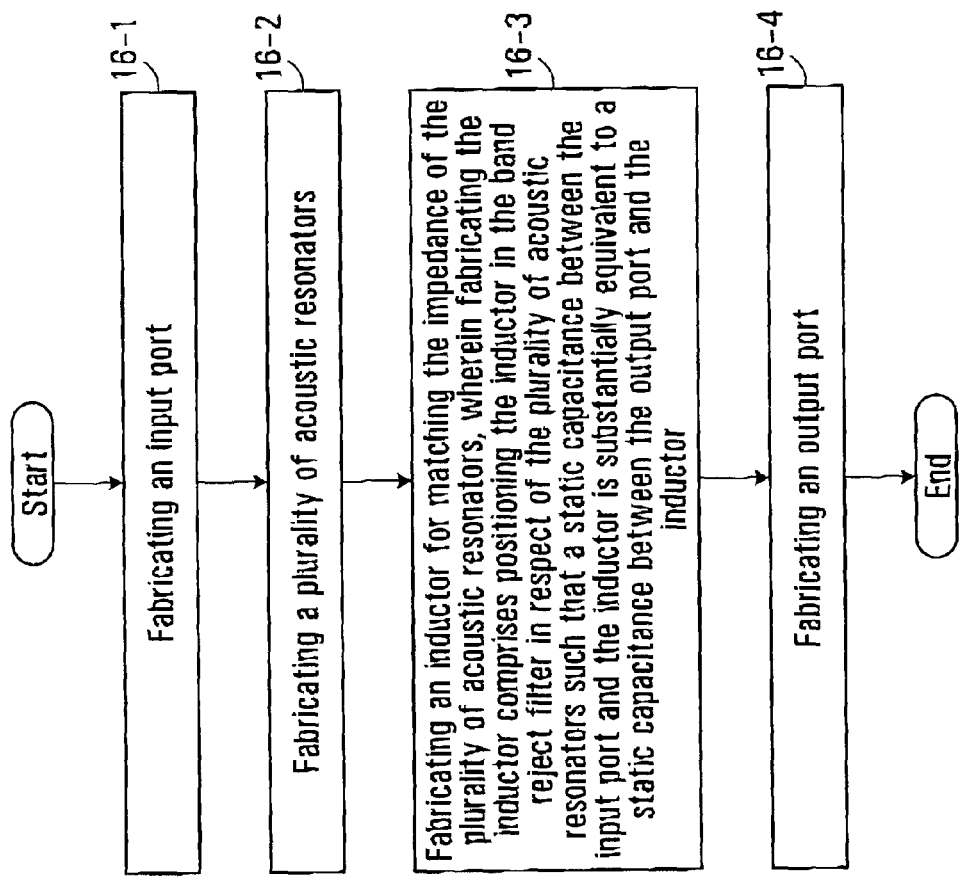
FIG. 16 is a flow chart illustrating a method according to an embodiment of the invention.

Referring to FIG. 16, a method for matching an impedance in a radio frequency BRF will now be described. In a first step 16-1, the method involves fabricating an input port for the BRF. A second step 16-2 involves fabricating a plurality of acoustic resonators. A third step 16-3 involves fabricating an inductor for matching the impedance of the plurality of acoustic resonators. A fourth step 16-4 involves fabricating an output port.

The inductor is positioned in the band reject filter in respect of the plurality of acoustic resonators such that a static capacitance between the input port and the inductor is substantially equivalent to a static capacitance between the output port and the inductor.

In some embodiments, the plurality of acoustic resonators is at least four acoustic resonators.

It is to be understood that the steps of the method do not necessarily need to be performed in the specific order described above. Depending on how the BRF is fabricated, for example different materials are layered upon one another, the input port, output port, acoustic resonators and the inductor may be fabricated simultaneously, in the order described above, or in a different order altogether.

Fabricating the BRF may be performed according to known SAW, FBAR and BAW technologies, wherein fabricating the inductor is controlled to provide a desired inductor.

Figure 17:
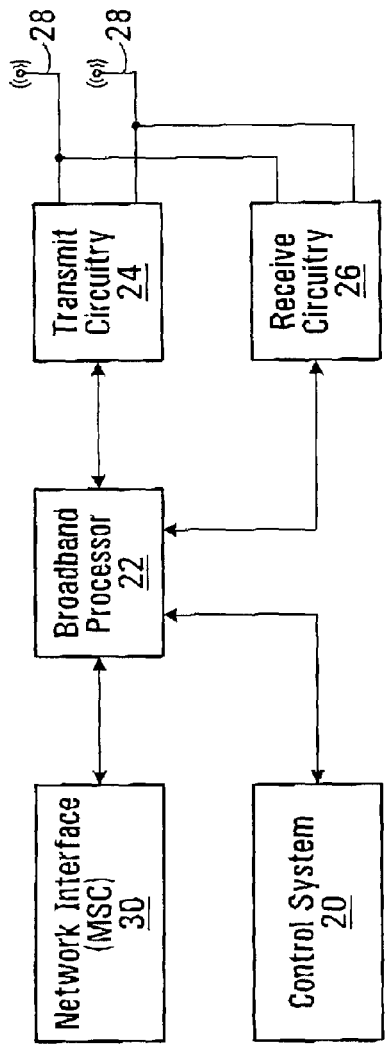
FIG. 17 is a block diagram of an example base station that might be used to implement some embodiments of the present application.

With reference to FIG. 17, an example of a base station 14 is illustrated. The base station 14 generally includes a control system 20, a baseband processor 22, transmit circuitry 24, receive circuitry 26, multiple antennas 28, and a network interface 30. The receive circuitry 26 receives radio frequency signals bearing information from one or more remote transmitters provided by mobile terminals 16 (illustrated in FIG. 11) and relay stations 15 (illustrated in FIG. 12). A low noise amplifier and a filter (not shown) may cooperate to amplify and remove broadband interference from the signal for processing. A BRF filter of the type described herein may be an example of a filter included in the receive circuitry 26. Downconversion and digitization circuitry (not shown) will then downconvert the filtered, received signal to an intermediate or baseband frequency signal, which is then digitized into one or more digital streams.

The baseband processor 22 processes the digitized received signal to extract the information or data bits conveyed in the received signal. This processing typically comprises demodulation, decoding, and error correction operations. As such, the baseband processor 22 is generally implemented in one or more digital signal processors (DSPs) or application-specific integrated circuits (ASICs). The received information is then sent across a wireless network via the network interface 30 or transmitted to another mobile terminal 16 serviced by the base station 14, either directly or with the assistance of a relay 15.

On the transmit side, the baseband processor 22 receives digitized data, which may represent voice, data, or control information, from the network interface 30 under the control of control system 20, and encodes the data for transmission. The encoded data is output to the transmit circuitry 24, where it is modulated by one or more carrier signals having a desired transmit frequency or frequencies. A power amplifier (not shown) will amplify the modulated carrier signals to a level appropriate for transmission, and deliver the modulated carrier signals to the antennas 28 through a matching network (not shown). Modulation and processing details are described in greater detail below. A BRF filter of the type described herein may also be included in the transmit circuitry 24.

Figure 18:
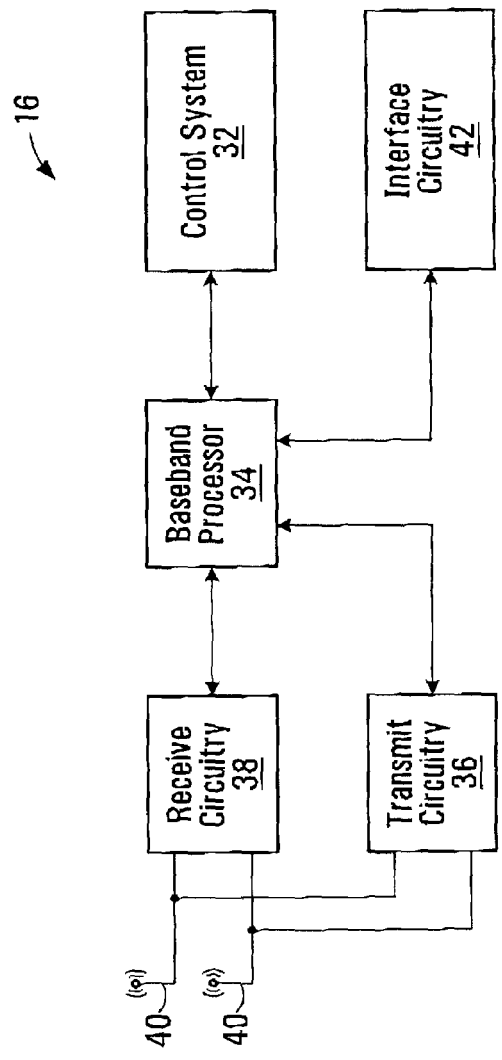
FIG. 18 is a block diagram of an example wireless terminal that might be used to implement some embodiments of the present application.

With reference to FIG. 18, an example of a mobile terminal 16 is illustrated. Similarly to the base station 14, the mobile terminal 16 will include a control system 32, a baseband processor 34, transmit circuitry 36, receive circuitry 38, multiple antennas 40, and user interface circuitry 42. The receive circuitry 38 receives radio frequency signals bearing information from one or more base stations 14 and relays 15. A low noise amplifier and a filter (not shown) may cooperate to amplify and remove broadband interference from the signal for processing. A BRF filter of the type described herein may be an example of a filter included in the receive circuitry 36. Downconversion and digitization circuitry (not shown) will then downconvert the filtered, received signal to an intermediate or baseband frequency signal, which is then digitized into one or more digital streams.

The baseband processor 34 processes the digitized received signal to extract the information or data bits conveyed in the received signal. This processing typically comprises demodulation, decoding, and error correction operations. The baseband processor 34 is generally implemented in one or more digital signal processors (DSPs) and application specific integrated circuits (ASICs).

For transmission, the baseband processor 34 receives digitized data, which may represent voice, video, data, or control information, from the control system 32, which it encodes for transmission. The encoded data is output to the transmit circuitry 36, where it is used by a modulator to modulate one or more carrier signals that is at a desired transmit frequency or frequencies. A power amplifier (not shown) will amplify the modulated carrier signals to a level appropriate for transmission, and deliver the modulated carrier signal to the antennas 40 through a matching network (not shown). A BRF filter of the type described herein may also be included in the transmit circuitry 24. Various modulation and processing techniques available to those skilled in the art are used for signal transmission between the mobile terminal and the base station, either directly or via the relay station.

The above-described embodiments of the present application are intended to be examples only. Those of skill in the art may effect alterations, modifications and variations to the particular embodiments without departing from the scope of the application.

Numerous modifications and variations of the present invention are possible in light of the above teachings. It is therefore to be understood that within the scope of the appended claims, the invention may be practised otherwise than as specifically described herein.

The invention claimed is:

1. A radio frequency band reject filter comprising:
an input port;
an output port;
a plurality of acoustic resonators coupled between the input port and the output port, wherein the plurality of acoustic resonators comprise a first plurality of acoustic resonators and a second plurality of acoustic resonators; and
an inductor positioned within the band reject filter, and comprising:
a first terminal coupled to ground; and
a second terminal coupled to a common node between the first plurality of acoustic resonators and the second plurality of acoustic resonators, wherein a static capacitance between the input port and the common node is substantially equivalent in value to a static capacitance between the output port and the common node;
wherein a combined impedance of the inductor and the plurality of acoustic resonators is equivalent in value to at least one of:
an impedance of the radio frequency band reject filter from the input port to ground; or
an impedance of the radio frequency band reject filter from the output port to ground.

2. The radio frequency band reject filter of claim 1 wherein the plurality of acoustic resonators are one of:
a plurality of parallel acoustic resonators;
a plurality of series acoustic resonators; and
a combination of series acoustic resonators and parallel acoustic resonators.

3. The radio frequency band reject filter of claim 2, wherein the combination of series acoustic resonators and parallel acoustic resonators comprises:
N, where N>2, series acoustic resonators; and
M, where M≥2, parallel acoustic resonators.

4. The radio frequency band reject filter of claim 3, wherein N is an even number and there are N/2 series acoustic resonators between the input port and the common node and N/2 series acoustic resonators between the output port and the common node.

5. The radio frequency band reject filter of claim 3 or claim 4, wherein M is an even number and there are M/2 parallel acoustic resonators between the input port and the common node and M/2 parallel acoustic resonators between the output port and the common node.

6. The radio frequency band reject filter of claim 1 wherein the radio frequency band reject filter is fabricated using one of: surface acoustic wave (SAW) technology; thin film bulk acoustic resonator (FBAR) technology; and bulk acoustic wave (BAW) technology.

7. The radio frequency band reject filter of claim 1 wherein the inductor is a short stub on-chip inductor.

8. The radio frequency band reject filter of claim 7 wherein the inductor has an inductance that is equal to or less than 0.1 nH.

9. The radio frequency band reject filter of claim 1 cascaded with one or more other radio frequency band reject filters.

10. The radio frequency band reject filter of claim 9, wherein at least one of the one or more other radio frequency band reject filters has an inductor for matching impedance of the respective at least one other radio frequency band reject filters.

11. The radio frequency band reject filter of claim 1, wherein the plurality of acoustic resonators comprise a combination of series acoustic resonators and parallel acoustic resonators, and wherein each series acoustic resonator of the series acoustic resonators and each parallel resonator of the parallel acoustic resonators is formed by a set of interdigital electrodes extending from a pair of parallel conductive elements.

12. The radio frequency band reject filter of claim 11, wherein for the parallel acoustic resonators, at least one of the pair of parallel conductive elements is coupled to ground.

13. The radio frequency band reject filter of claim 11, wherein for at least one series acoustic resonator or at least one parallel acoustic resonator, or both, at least one of the pair of parallel conductive elements forming the respective acoustic resonator is coupled to the inductor.

14. The radio frequency band reject filter of claim 13, wherein the inductor is a short stub element located between the at least one of the pair of parallel conductive elements and ground.

15. The radio frequency band reject filter of claim 1 wherein the inductance of the inductor can be fabricated accurately enough that external matching circuits are not used with the filter.

16. A telecommunication base station comprising:
at least one antenna;
transmit circuitry configured for modulating one or more carrier signals having a desired transmit frequency or frequencies;
receiving circuitry configured for receiving a radio frequency signal bearing information from one or more remote transmitters;
a baseband processor configured for:
processing a received signal received by the receiving circuitry; and
encoding a signal for transmission by the transmit circuitry;

at least one of the transmit circuitry or receiving circuitry comprising the radio frequency band reject filter of claim 1.

17. A telecommunication wireless terminal comprising:
at least one antenna;
transmit circuitry configured for modulating one or more carrier signals having a desired transmit frequency or frequencies;
receiving circuitry configured for receiving a radio frequency signal bearing information from one or more remote transmitters;
a baseband processor configured for:
  processing a received signal received by the receiving circuitry; and
  encoding a signal for transmission by the transmit circuitry;
at least one of the transmit circuitry or receiving circuitry comprising the radio frequency band reject filter of claim 1.

18. A duplexer comprising the radio frequency band reject filter of claim 1.

19. A method of impedance matching during the fabrication of a radio frequency band reject filter comprising:
fabricating an input port;
fabricating an output port;
fabricating a plurality of acoustic resonators between the input port and the output port, comprising fabricating a first plurality of acoustic resonators and a second plurality of acoustic resonators;
fabricating an inductor that comprises a first terminal configured to couple to ground, and further comprises a second terminal;
wherein fabricating the inductor comprises coupling the second terminal of the inductor to a common node between the first plurality of acoustic resonators and the second plurality of acoustic resonators, wherein a static capacitance between the input port and the common node is substantially equivalent in value to a static capacitance between the output port and the common node; and
wherein a combined impedance of the inductor and the plurality of acoustic resonators is equivalent in value to at least one of:
  an impedance of the radio frequency band reject filter from the input port to ground; or
  an impedance of the radio frequency band reject filter from the output port to ground.

20. The method of claim 19, wherein fabricating the inductor comprises fabricating a short stub on-chip element that has a desired inductance.

21. The method of claim 20 wherein fabricating a short stub on-chip element that has a desired inductance comprises controlling at least one of the length, width, and thickness of the short stub on-chip element.

* * * * *